United States Patent [19]

Jernigan

[11] Patent Number: 5,642,307

[45] Date of Patent: Jun. 24, 1997

[54] DIE IDENTIFIER AND DIE INDENTIFICATION METHOD

[75] Inventor: Clark W. Jernigan, Tokyo, Japan

[73] Assignee: Advanced Micro Devices, Inc., Sunnyvale, Calif.

[21] Appl. No.: 268,719

[22] Filed: Jun. 30, 1994

Related U.S. Application Data

[63] Continuation of Ser. No. 911,138, Jul. 9, 1992, abandoned.

[51] Int. Cl.⁶ .................................... G11C 17/00
[52] U.S. Cl. ................ 365/103; 365/94; 365/96; 365/201; 257/48; 257/797; 235/375; 438/18
[58] Field of Search ............... 365/230.03, 94, 365/96, 103, 104, 201; 257/48, 797; 235/375; 437/8, 226

[56] References Cited

U.S. PATENT DOCUMENTS

| | | | |
|---|---|---|---|
| 4,055,802 | 10/1977 | Panousis et al. | 324/73.1 |
| 4,150,331 | 4/1979 | Lacher | 324/73 PC |
| 4,166,574 | 9/1979 | Yokoyama | 235/375 |
| 4,419,747 | 12/1983 | Jordan | 365/96 |
| 4,451,903 | 5/1984 | Jordan | 365/94 |
| 4,510,673 | 4/1985 | Shils et al. | 29/574 |
| 5,056,061 | 10/1991 | Akylas et al. | 365/96 |
| 5,254,482 | 10/1993 | Fisch | 437/8 |

FOREIGN PATENT DOCUMENTS

| | | |
|---|---|---|
| 0057645A1 | 8/1982 | European Pat. Off. . |
| 0132520A3 | 2/1985 | European Pat. Off. . |
| 0353530A1 | 2/1990 | European Pat. Off. . |
| 0420388A2 | 4/1991 | European Pat. Off. . |
| 0430844A2 | 6/1991 | European Pat. Off. . |
| 59-150464A | 8/1984 | Japan . |
| 2244339A | 11/1991 | United Kingdom . |

OTHER PUBLICATIONS

IBM Technical Disclosure Bulletin, Oct. 1979, US, "Array Chip Identification. Oct. 1979", vol. 22, No. 5, pp. 1879–1880.

G. L. Hutchins, IBM Technical Disclosure Bulletin, Oct. 1980, "Semiconductor Chip Traceability Method", vol. 23, No. 5, p. 1829.

Research Disclosure, Dec. 1989, No. 308, New York, US, Disclosed Ananymously, "Component Identification Data Retrieval Via Serial Interface", p. 954.

Primary Examiner—David C. Nelms
Assistant Examiner—Andrew Q. Tran
Attorney, Agent, or Firm—Jenkens & Gilchrist, P.C.

[57] ABSTRACT

An identification section fabricated onto a semiconductor integrated circuit includes structure for storing die-specific information that characterizes that particular integrated circuit. The identification section may also include structure for reading the die-specific information from the structure for storing. In addition or otherwise, the identification section may also include structure for programming the die-specific information into the structure for storing.

18 Claims, 4 Drawing Sheets

DIE IDENTIFIER AND DIE INDENTIFICATION METHOD

This is a continuation of application Ser. No. 07/911,138, filed Jul. 9, 1992, now abandoned.

BACKGROUND OF THE INVENTION

1. Field of the Invention

The present invention generally relates to systems for preserving information relating to semiconductor integrated circuits and, more particularly, systems for preserving information regarding the manufacturing history of semiconductor integrated circuits.

2. History of the Prior Art

Semiconductor integrated circuits are batch fabricated on wafers of semiconductor material generally five to eight inches in diameter. Each wafer typically has a two-dimensional array of die, each die having one integrated circuit. These wafers are processed in groups which are referred to as fabrication lots. Each fabrication lot is identified by a unique fabrication lot number. Each wafer within a given fabrication lot is identified by a unique wafer number. The wafer number and the fabrication lot number for a particular wafer are inscribed on that wafer in an area outside the array of die. Thus, during the initial fabrication process, every die may be uniquely identified by certain die-specific information such as its fabrication lot number, its wafer number, and its location within the array of die hereinafter referred to as its die position number.

The unique identification of the die, if available, can serve important functions in the analysis of non-production or developmental die (e.g., die characterization, reliability testing) and of regular production die (e.g., wafer sort yield analysis, the analysis of die returned by customers). For example, engineers frequently need to characterize the die by analyzing the effect of a processing variable on the electrical properties of the die. To do this, the engineer will typically split a lot into groups of wafers during fabrication, each group to be processed with the particular processing variable set to a different value. After the die are processed and individually packaged, electrical parameters of each die are tested, and the test results are saved along with the die's wafer number and die position number. With this data an engineer is able to compare the performance of the groups of wafers with one another, and thus determine the effect of the processing variable on die performance. This information also enables an engineer to analyze the electrical performance of the die as a function of its position on the wafer during fabrication.

The unique identification of a die serves a similar purpose in the reliability testing of the die. To test its reliability, the die may be subjected to conditions such as extreme temperatures or humidity for extended periods and then electrically tested. The unique identification of each die enables an engineer to analyze the test results and determine the reliability of the die as a function of processing parameters, and also as a function of its position on the wafer during fabrication.

With respect to regular production die, a die's unique identification, if available, may also serve an important function in the analysis of defective die returned by customers. The die from a particular lot may be sold to many different customers over a long period of time. When defective die from a particular fabrication lot are returned by a customer, an engineer will typically analyze the returned die to determine the cause of the malfunction. The unique identification of the die allows the engineer to determine the manufacturing history of the returned die, which may provide information which is helpful in this analysis. Also, if the engineer knows which fabrication lot the die came from, he may be able to avoid repetitive analysis on future customer returns from that same lot.

Currently, those skilled in the art view the retention of the unique identification of a die throughout the life of the die as a time-consuming, expensive, and error-prone process. In the course of normal production, a die's unique identification could be useful in yield enhancement analysis and in the analysis of customer returns. Presently, however, the wafer number and die position number are usually lost after the wafer is sawed into individual die, and thus not available for subsequent yield enhancement analysis. Also, after the wafer is sawed, a new assembly lot number is assigned to each lot and encoded onto each package into which the die is assembled. The fabrication lot number is retained only in the paper records for that assembly lot. Thus, an engineer faced with a die returned from a customer must search the assembly lot records to find the fabrication lot number. These records may be incomplete or may have been misplaced or disposed of after a certain period of time. Without the information from these records, an engineer will not be able to determine the die's fabrication lot number. Even if the records are available and complete, the wafer number and die position number cannot be determined.

In order to retain the unique identification of each die for non-production purposes such as die characterization or reliability testing, the wafers are sent to a non-production assembly area with special instructions to preserve the identification of each die. The die's identification is usually preserved by handwriting the information on each individual package into which the die are assembled. This process is not automated, and it is possible that the die will be mixed up and identified incorrectly. Because there is no way to be sure that the die are identified correctly, confidence in the die characterization or reliability testing is diminished greatly.

From the foregoing it can be seen that it would be quite desirable to ensure that the unique identification of each die is recorded correctly and retained throughout the life of the die. It may also be seen that it is a shortcoming and deficiency of the prior art that heretofore no system or method for accomplishing this has been developed.

SUMMARY OF THE INVENTION

To overcome the shortcomings and deficiencies of the prior art, the present invention provides a device having a die that is characterized by die-specific information and that includes an identification section. The identification section includes a structure for storing the die-specific information and a structure for reading the die-specific information from the structure for storing. In addition, the identification section may provide a structure for programming the die-specific information into the structure for storing.

In some embodiments of the present invention, the structure for storing may be a memory section. The memory section may be non-volatile, and furthermore, may be fuse-programmable.

The structure for reading may be enabled by forcing the die into a test mode. In addition, the structure for reading may include device pins which serve other functions when the die is not in a test mode.

In embodiments having a structure for programming, the programming may be enabled by forcing the die into a test mode. In addition, the structure for programming may include device pins which serve other functions when the die is not in a test mode.

The die-specific information may include the fabrication lot number, the wafer number, and the die position number associated with the particular die.

Furthermore, the present invention provides a method of preserving die-specific information by providing the die with a structure for storing information and then storing the die-specific information into the structure for storing. The step of providing the die with a structure for storing information may include the step of providing a non-volatile memory which may, in some embodiments, be fuse-programmable.

In certain embodiments, the method for preserving die-specific information may include the step of reading the die-specific information from the structure for storing. The step of reading the die-specific information may include the step of forcing the die into a test mode, and may further include the step of reading via device pins which serve other functions when the die is not in a test mode.

According to certain teachings of the present invention, the step of storing may include the step of programming the die-specific information into the structure for storing, and may further include the step of forcing the die into a test mode. In addition, the die-specific information may be programmed via device pins which perform other functions when the die is not in a test mode.

In certain embodiments, the step of programming the die-specific information may be performed before the completion of wafer sort testing, and may be performed by an automated test program.

Still further, the present invention provides a method for conducting engineering analysis of a die characterized by die-specific information. This method may include the steps of storing the die-specific information on the die, reading the die-specific information from the die, tying the die-specific information to test data relating to the die, and analyzing the test data using associations made by tying the die-specific information to the test data.

Furthermore, the present invention also provides a method of tracing the manufacturing history of a die. This method includes the steps of fabricating a structure for storing onto the die, storing information relating to the manufacturing history into the structure for storing, and retrieving that information from the structure for storing.

Accordingly, it is an object of the present invention to provide a storage means on a die that may be used to trace the manufacturing history of the die easily and with accuracy.

Another object of the present invention is to provide a storage means on a die which affords an inexpensive and dependable means of identification.

BRIEF DESCRIPTION OF THE DRAWINGS

Other objects, advantages and novel features of the present invention will become apparent from the following detailed description of the invention when considered in conjunction with the accompanying drawings wherein.

DETAILED DESCRIPTION OF THE INVENTION

Figure 1A:
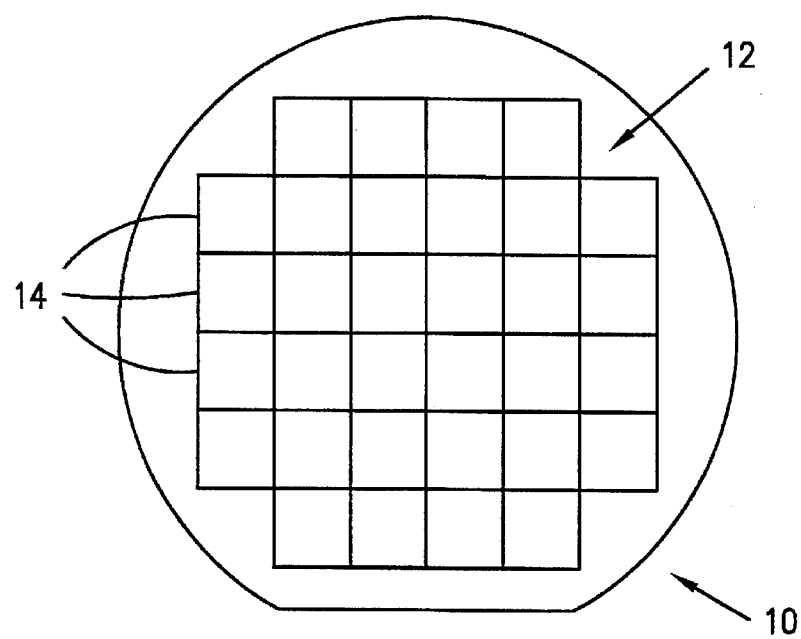
FIG. 1a is a top plan of a single wafer containing an array of die.

Referring now to the drawings wherein depicted elements are not necessarily shown to scale, there is shown in FIG. 1a a single wafer generally designated by reference numeral 10, having an array of die, this array generally designated by reference numeral 12. The array 12 is made up of a plurality of die 14. As may be seen in FIG. 1b, each individual die 14 has an identification section 16 according to the teachings of the present invention as well as an integrated circuit 18. In its preferred embodiment, the identification section 16 should be designed to occupy an area on the die 14 small enough to minimize the associated "real estate" cost and to allow for easy insertion into existing layouts, but not so small as to push design rules (e.g., minimum width of a polysilicon line) to the point that overall device yield will be adversely affected. In one possible embodiment of the present invention, as shown in FIG. 1b, the identification section 16 comprises three sections: a memory section 20, programming circuitry 22, and output circuitry 24.

Figure 1B:
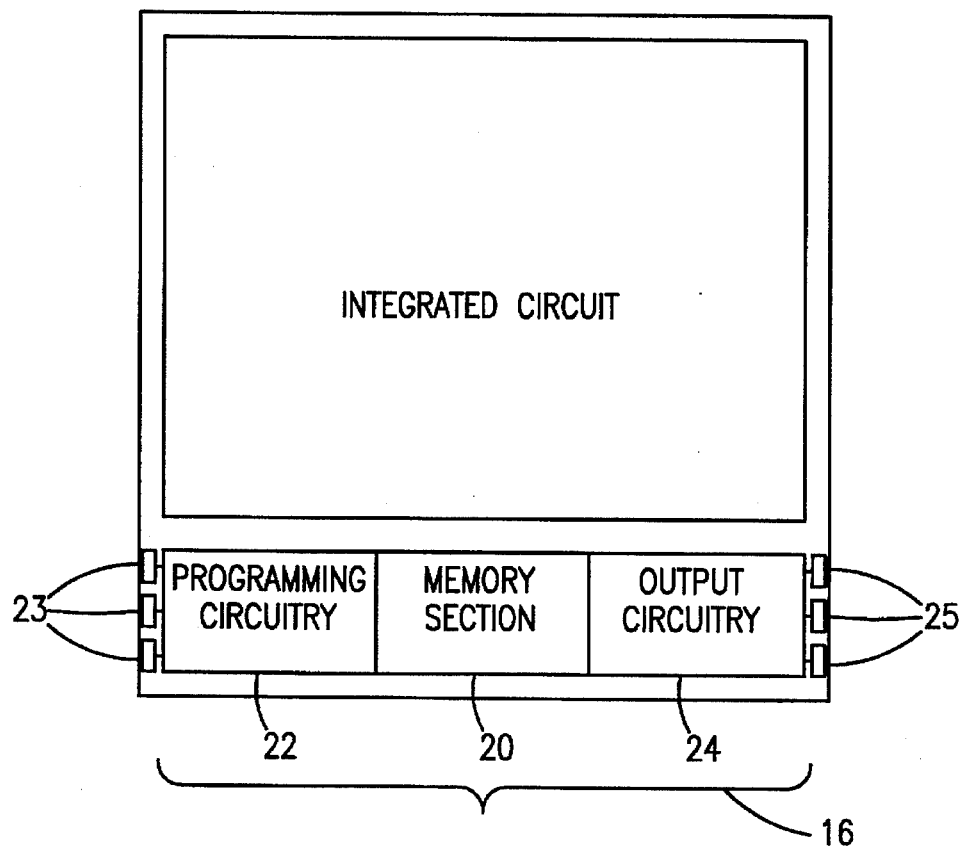
FIG. 1b is an enlarged view of one of the die shown in FIG. 1a, this FIG. 1b showing a die having a possible embodiment of the identification section according to the teachings of the present invention.

Referring to FIG. 1b, the embodiment of the identification section having a memory section, programing circuitry, and output circuitry will now be described. The memory section 20 stores the die-specific information which characterizes the die 14. The memory section 20 may be of a non-volatile nature in order to preserve the die-specific information for the life of the die. In a preferred embodiment, the non-volatile memory section 20 may be fuse-programmable. One possible advantage of using fuse-programmable memory is that it allows retrieval of the die-specific information, even if the die 14 becomes non-functional, by visually decoding the fuses.

The identification section of the present invention also provides a structure for reading the die-specific information from the memory section 20. In the embodiment shown in FIG. 1b, die-specific information may be read from the memory section 20 via output circuitry 24. The output circuitry 24 may be connected to die pads 25 which allow external access to the output circuitry 24. Thus, the output circuitry 24 may be used to access die-specific information from the memory section 20 and conduct that information out to die pads 25. The die pads 25 may serve other functions in the normal operation of the integrated circuit 18, and may be converted for use in reading information out of the memory section 20 in an operation in which the die 14 is forced into a test mode. The dual operation of the die pads 25 may prove valuable to those skilled in the art because it may be employed to reduce device pin count.

In certain embodiments, the memory section of the identification section may be capable of being programmed with the die-specific information. In the embodiment shown in FIG. 1b, memory section 20 may be programmed with die-specific information received from programming circuitry 22. The programming circuitry 22 may be electrically connected to die pads 23 to allow a connection to external electrical signals. Thus, the programming circuitry 22 may receive die-specific information via die pads 23 and in response thereto, program the received die-specific information into the memory section 20. The die pads 23 may serve other functions in the normal operation of the integrated circuit 18, and may be converted for use in programming the memory section 20 in an operation in which the die 14 is forced into a test mode. Such dual operation of the die pads 23 can prove valuable to those skilled in the art because it may be employed to reduce device pin count in certain applications.

It should be noted that in some embodiments of the identification section of the present invention, it is possible that a single set of die pads may perform the functions of both die pads 23 and die pads 25 shown in FIG. 1b.

Based upon the foregoing, those skilled in the art should now appreciate that, in essence, the present invention comprises a structure for storing information on a die in which die-specific information may be stored, and a structure for reading the die-specific information from the structure for storing. The structure for storing information and the structure for reading may be the above mentioned memory section 20 and output circuitry 24, respectively. Associated with the memory section 20 in embodiments of the present invention may also be means for moving information into the memory section, such as the programming circuitry 22.

It should be kept in mind, however, that the identification section of the present invention may be embodied differently. For example, the identification section may provide means for storage such as ROM type memory, and means for reading the die-specific information from the ROM type memory. The ROM type memory may be programmed by photomasking techniques during wafer fabrication. ROM type memory may be preferable over fuse-programmable memory as it may require less surface area on the die and it does not require the fabrication area to support fuse-programmable technology.

Another possibility is that the identification section may comprise some circuitry capable of being hard-wired to contain the die-specific information during wafer fabrication, and means for reading the die-specific information from such circuitry. Hard wiring the identification information may be accomplished by photomasking at any of the fabrication processing steps at which interconnections are made, such as the source-drain implant, polysilicon, metal or contact steps. Also, the die-specific information may be stored into interconnect material by a laser-cutting process during wafer fabrication.

Another possibility is that the identification section of the present invention may combine two or more of the storage mechanisms mentioned above. For example, the fabrication lot number and wafer number may be programmed into hard-wired circuitry by a laser-cutting process while the die position number may be programmed into fuse-programmable memory at wafer sort test step.

Figure 2:
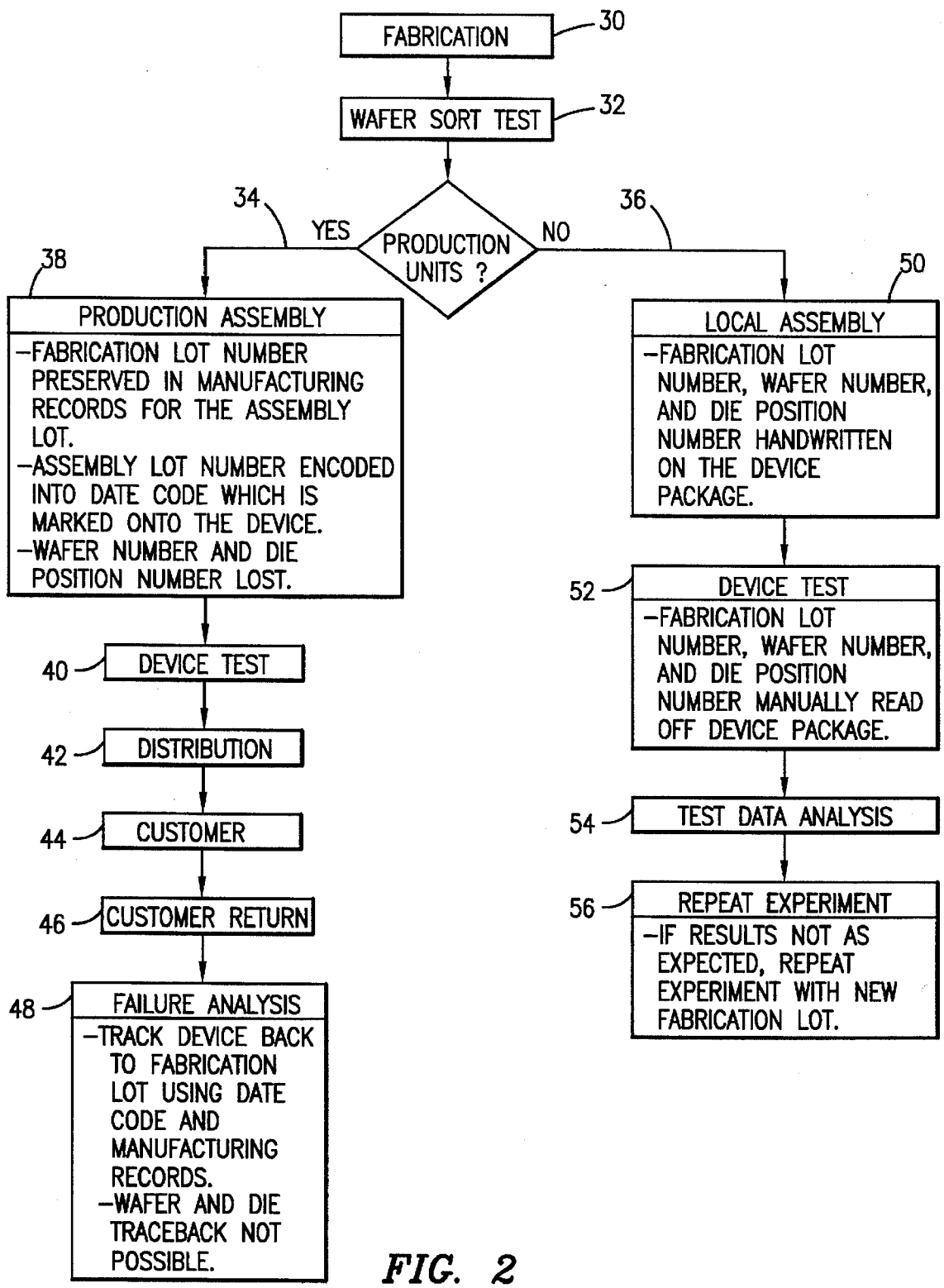
FIG. 2 is a flowchart which illustrates the steps taken in a prior art method of handling die which method includes provisions for preserving die-specific information.
Figure 3:
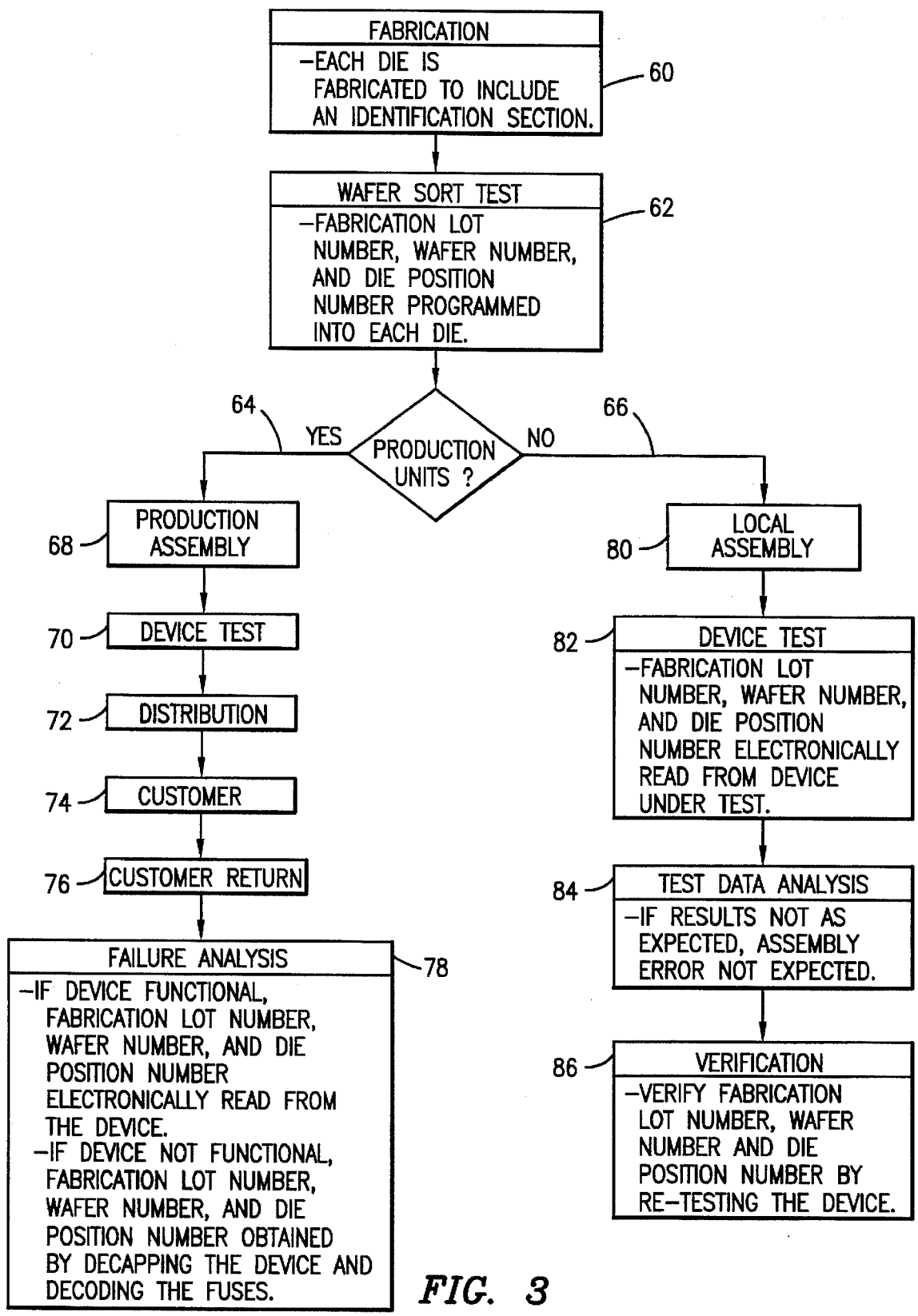
FIG. 3 is a flowchart which illustrates the steps that may be taken in a die handling method of die that incorporates the identification section of FIG. 1b.

The importance of preserving die-specific information in an identification section 16 located on a die 14 can be seen by comparing the use of a prior art method of preserving the die-specific information, shown in FIG. 2, with the use of a method taught by the present invention of preserving the die-specific information, shown in FIG. 3. The flowchart in FIG. 2 shows steps typical of both the standard production and non-production flow of a die 14. The die are batch-fabricated on a single wafer 10, each wafer 10 having a two-dimensional array of die 12 (step 30). As discussed previously in the background of the invention section, each die 14 may be uniquely identified by its fabrication lot number, its wafer number, and its die position number. Once fabrication is completed, each die 14 is electrically tested at the wafer sort step 32 while still in wafer format. After the wafer sort step 32, the die 14 may enter either the standard production flow (designated by arrow 34) and ultimately be distributed to a customer, or a non-production flow (designated by arrow 36) usually for the purpose of engineering analysis.

In the standard production flow 34, the wafers 10 are sent to production assembly (step 38) where the wafers 10 are scribed and the die 14 separated from each other and assembled into packages. At this point in a standard production process, the wafer number and die position number are irretrievably lost. The die 14 are assigned a unique assembly lot number and the fabrication lot number is preserved in manufacturing records for that assembly lot. The assembly lot number is encoded into a date code which is marked onto the package into which the die 14 was assembled. At the device test step 40 following the production assembly step 38, each packaged die 14 is electrically tested. The wafer number and die position number cannot usually be determined at this point and are therefore not available for use in analyzing the test results obtained during device testing. Such analysis would be helpful in yield enhancement studies.

Units which pass device testing are forwarded to a distributor (step 42) for shipment to a customer (step 44). If the customer determines that the packaged die is defective, it is customary for the customer to return the die to its manufacturer (shown as step 46) for failure analysis (shown as step 48). Failure analysis may often involve determining whether a die was misprocessed. In order to determine whether a die was misprocessed, those skilled in the art find it advantageous to know the die's manufacturing history. The fabrication lot number is usually needed in order to determine the die's manufacturing history, but can typically be found only in the manufacturing records associated with the assembly lot number indicated on the device package. The packaged die may have remained at a distributor site for an extended period of time before shipment to the customer, or may have failed after an extended period of operation in the end user's application. Thus, by the time the die 14 is returned as defective, the manufacturing records may have been lost or purged. Consequently, the manufacturer may be unable to trace the die 14 back to a fabrication lot in order to determined whether the die 14 was misprocessed or not. In any case, tracing back to the wafer number or die position number, which could also be useful in this analysis, is not possible.

In a non-production flow route 36, the die 14 are typically used by engineers for engineering analysis such as device characterization or reliability testing. As discussed previously in the background of the invention section, this engineering analysis often involves splitting a fabrication lot into groups, each group being fabricated according to different settings of processing variables. In this context, the identification of each die 14 serves an essential function of correlating a particular die 14 to a particular setting of a processing variable. Referring back again to FIG. 2 and the non-production flow route 36, after the wafer sort step 32, the wafers 10 are sent to local assembly (step 50) with instructions to preserve the die-specific information such as the fabrication lot number, wafer number and die position number by handwriting the information on each package into which the die 14 is assembled. Those skilled in the art, (that is, the engineers who use the die for engineering analysis) view this step as expensive and exceedingly error-prone. Also, after the local assembly step 50 no means are available by which to verify the die-specific information marked on any particular package. When the packaged die are then returned to the engineers for device testing (step 52), the die-specific information for each die is manually read off the package and recorded with the test results for that die. The test data is then analyzed according to the fabrication lot number, wafer number or die position number in order to determine lot to lot, wafer to wafer, or position to position variation in die electrical performance, respectively. This analysis takes place at step 54 shown in FIG. 2. If the test results deviate from what was expected, those skilled in the art will typically suspect an error in die identification and may repeat the experiment with a new fabrication lot (step 56). Alternative results that are not shown in FIG. 2 include the use of the results as obtained with doubt as to its validity, or the scrapping of the data and making an engineering decision based on incomplete information.

FIG. 3 shows a flowchart describing the use of one possible embodiment of the identification section as shown in FIG. 1b, in a production and non-production flow of an integrated circuit. Each die 14 may be fabricated to include an identification section 16 as shown in FIG. 1b. This fabrication step is shown as step 60 in FIG. 3. At the wafer sort test step 62, each die 14 on the wafer 10 may be electrically connected to an automated test machine which executes a series of routines testing the electrical properties of the die 14. According to certain teachings of the present invention, such as an identification section 16 including fuse-programamble memory, the test machine may also program the fabrication lot number, wafer number and die position number specific to a particular die into the identification section 16 of that die 14. To do so, the test machine may force the die 14 into a test mode and apply electrical signals to the die pads 23 connected to the programming circuit 22 such that the information is stored in the memory section 20. To eliminate the need for excess pads on the die 14, die pads 23 may be existing pads that serve other functions during normal operation of the die, and that may be converted for use in accessing the identification section 16 when the die is in a test mode. It should be noted, however, that the die-specific information could be programmed into the identification section 16 at an earlier point during wafer fabrication, such as at preliminary test points known to those skilled in the art as wafer electrical test steps.

At any time following the programming of the die-specific information, this information can be retrieved from the die 14 electronically by forcing the die 14 into a test mode and reading the information stored in the identification section 16. The information may also be determined by visual inspection. For example, if the memory section employs fuse-programmable memory, the die-specific information may be retrieved by decapping the packaged die and visually examining the fuses in the identification section 16. Other retrieval means may also be employed.

In the standard production flow (designated by arrow 64 in FIG. 3), the die next enter the production assembly step 68. Because the die-specific information is stored in the identification section 16 of each die 14, this information is not lost at the production assembly step 68 when the wafers 10 are scribed and the die 14 separated from each other. Following the production assembly step 68, the packaged die are electronically tested (step 70). At this point, the die-specific information may be read from the packaged die and may be associated with the test data resulting from test points such as wafer sort test 62 and device test 70. Such associations between the die-specific information and the test data may be useful in yield enhancement studies. It should be noted that other processing and test steps, such as reliability test steps and quality control test steps that are not shown in FIG. 3, may be inserted into a production test flow, and that the retention of die-specific information may be helpful in analyzing the test data collected at these test steps as well.

The die which pass device testing are advanced to the distribution step (shown as step 72) for eventual shipment to a customer (step 74). If the customer returns the packaged die to the manufacturer (step 76) for failure analysis (step 78), the manufacturer will be able to read the die-specific information preserved in the identification section 16 of that die 14, whether the die is functional or not. This die-specific information may be helpful in determining the manufacturing history of the defective die and in determining the cause of the malfunction.

In a non-production flow (designated by arrow 66 in FIG. 3), the die 14 are sent to local assembly (step 80) following wafer sort test (step 62). Because the die-specific information is stored in the identification section 16 on each die 14, it is not necessary at this step 80 to manually track the die-specific information nor to handwrite the information on each package into which a die is assembled. At the following device test step 82, the die-specific information may be electronically read from the die 14 and this information stored with the test data corresponding to that die (step 84). The data may then be analyzed to determine lot to lot, wafer to wafer, or position to position variations in electrical performance of the die. The use of the identification section 16 to preserve the die-specific information allows the engineer to be confident that the die are correctly identified. If the results are not as expected, the engineer may verify the die-specific information by electronically reading the information from the packaged die (step 86). Thus, the use of a programmable identification circuit according to the teachings of the present invention may allow an engineer to at least eliminate the possibility of error at the local assembly step 80 in maintaining the correct die identification.

Based on the foregoing, it should now be clear that the present invention provides an identification section on a die characterized by die-specific information that can be used to preserve the die-specific information, and a method for preserving die-specific information. The die are fabricated to include a storage structure, in which die-specific information may be stored. The storage structure may be, for example, hard-wired circuitry, ROM type memory, or fuse-programmable memory. The die-specific information may be stored into the storage structure at some point before the wafer is sawed into individual die. The storage of the die-specific information onto the die itself is considered useful to those skilled in the art as it allows engineers and others to retrieve die-specific information such as the die's fabrication lot number, wafer number, and die position number from the die. In addition, embodiments of the present invention implementing fuse-programmable memory may be used to store die-specific information at some point after the wafer is sawed into individual die.

Figure 4:
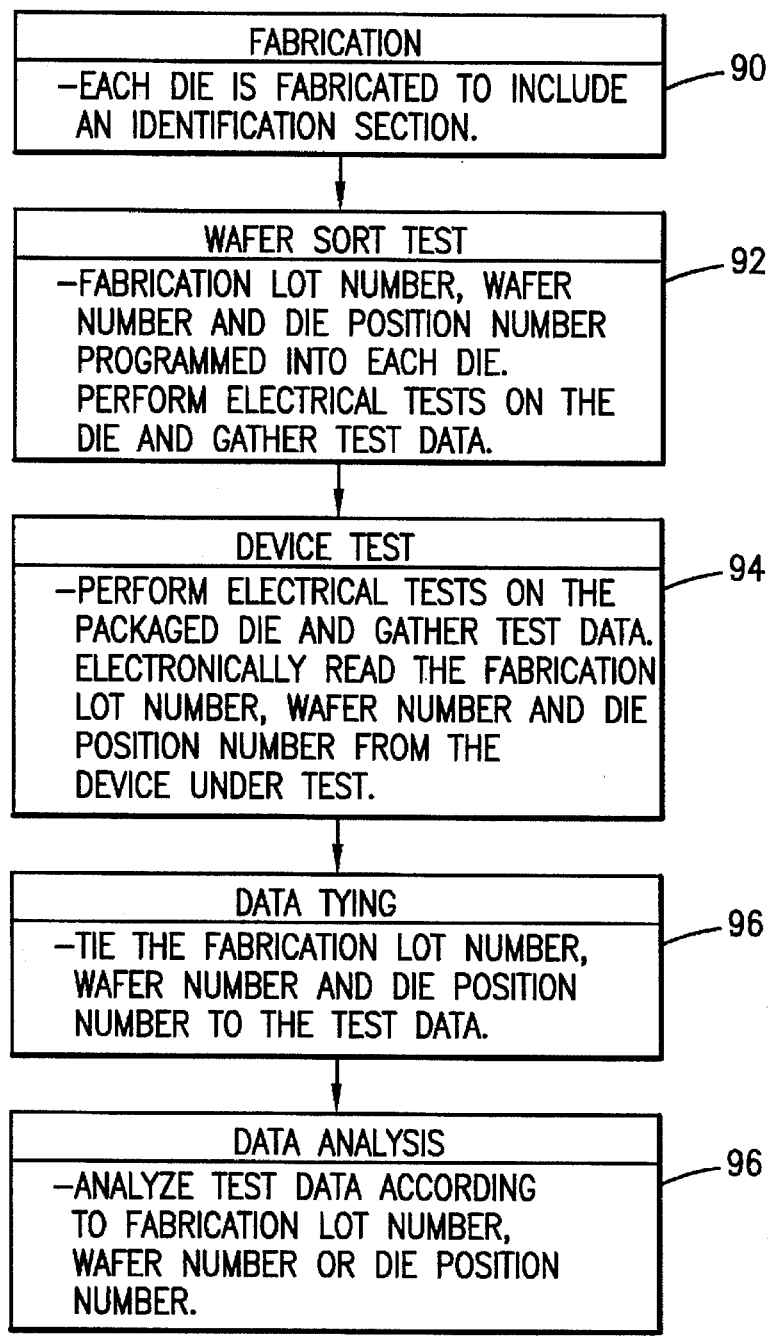
FIG. 4 is a flowchart which illustrates a method of analyzing data relating to the electrical performance of a die that incorporates the identification section of FIG. 1b.

Referring now to FIG. 4, it may be seen that the use of the identification section, such as the identification section 16 of FIG. 1b, may offer an advantageous method for analyzing data relating to the electrical performance of a die. During fabrication (shown as step 90 in FIG. 4), each die 14 may be provided with an identification section 16. The die-specific information (which may include the fabrication lot number, wafer number, and die position number) may be stored into each die while still in wafer format. Some embodiments, such as those implementing fuse-programmable memory, may be programmed with the die-specific information at the wafer sort test step 92. It should be remembered that, in certain embodiments of the identification section of the present invention, the die-specific information may be stored at some point before wafer sort test step 92. For example, an identification section implementing ROM type memory may be programmed by photomask during wafer fabrication (step 90).

At both the wafer sort test step 92 and the device test step 94, an automated test machine may perform a series of electrical tests on the device. The results of these tests may be stored in a file on disk, tape or other storage means. Also at the device test step 94, the automated tester may access the die-specific information from the memory section 20. This die-specific information may then be stored on disk, tape, or other storage means and may be tied to the test results for that particular die (step 96). By tying it is meant that an association is made between the die-specific information and the test results for a particular die. Such associations may be useful in the analysis of the test results (step 98). For example, the association may be useful in the sorting, searching, filtering, or grouping of test results according to the die-specific information. This analysis of the test data may occur on either a tester or other computer. The tying of the test data to the die-specific information is important because it may be particularly useful in detecting lot to lot, wafer to wafer, or die position to die position variations in the electrical performance of the die.

The foregoing description shows only certain particular embodiments of the present invention. Those skilled in the art will recognize that many modifications and variations may be made without departing substantially from the spirit and scope of the present invention. For example, the die-specific information may also include other information such as but not limited to test program revisions, parameter characteristics, and the pass/fail results of certain tests. Accordingly, within the scope of the appended claims, the present invention may be practiced otherwise than as specifically described hereinabove.

What is claimed is:

1. A die comprising:

a first integrated circuit portion; and a second integrated circuit portion, said first and said second integrated circuit portions being adjacent each other on said die, said second integrated circuit portion comprising:

at least one bidirectional die pad;

programming circuitry connected to said at least one bidirectional die pad;

a memory section connected to said programming circuitry for storing a die specific information;

output circuitry connected to said memory section and said at least one bidirectional die pad.

2. The die as set forth in claim 1, further comprising:

a unidirectional die pad, said unidirectional die pad being electrically connectable to at least one of said first integrated circuit portion and said second integrated circuit portion.

3. The die as set forth in claim 1, wherein said memory section comprises a plurality of non-volatile memory cells.

4. The die as set forth in claim 1, wherein said memory section comprises a plurality of fusible links.

5. The die as set forth in claim 1, wherein said memory section comprises a plurality of laser-blown fuses.

6. The die as set forth in claim 1, wherein said die specific information includes a fabrication lot number, said fabrication lot number identifying a fabrication lot from which the die originated.

7. The die as set forth in claim 1, wherein said die specific information includes a wafer number, said wafer number identifying a wafer from which the die originated.

8. The die as set forth in claim 1, wherein said die specific information includes a die position information, said die position information relating to the position of the die on a wafer from which the die originated.

9. The die as set forth in claim 1, wherein said die specific information includes at least one of a design rule information and a process history information.

10. An apparatus for providing a user with semiconductor processing and test information relating to a first circuit disposed on a semiconductor die, the apparatus comprising:

a storage structure having a plurality of storage locations disposed on said semiconductor die adjacent said first circuit;

means for storing said semiconductor processing and test information into at least a subset of said plurality of storage locations; and bidirectional access means for accessing said subset of said plurality of storage locations.

11. The apparatus as set forth in claim 10, wherein said plurality of storage locations comprises a plurality of non-volatile memory cells.

12. The apparatus as set forth in claim 10, wherein said plurality of storage locations comprises a plurality of fusible links.

13. The apparatus as set forth in claim 10, wherein said plurality of storage locations comprises a plurality of laser-blown fuses.

14. A device for providing users with semiconductor processing and test information relating to a primary circuit disposed on a semiconductor chip, said device comprising:

storage means disposed on said semiconductor chip for storing said semiconductor processing and test information, said storage means being electrically isolated from said primary circuit;

input means for accessing at least a portion of said storage means;

programming means for programming said semiconductor processing and test information into said portion of said storage means; and output means for providing output signals representative of said semiconductor processing and test information when said portion of said storage means is accessed.

15. The device as set forth in claim 14, wherein said storage means comprises a plurality of non-volatile memory cells.

16. The device as set forth in claim 14, wherein said storage means comprises a plurality of fusible links.

17. The device as set forth in claim 14, wherein said storage means comprises a plurality of laser-blown fuses.

18. The device as set forth in claim 14, wherein said storage means comprises a plurality of read-only-memory cells.

* * * * *

UNITED STATES PATENT AND TRADEMARK OFFICE
CERTIFICATE OF CORRECTION

PATENT NO. :     5,642,307
DATED      :     Jun. 24, 1997
INVENTOR(S) :    Jernigan It is certified that error appears in the above-identified patent and that said Letters Patent is hereby corrected as shown below:

Title Page, Item [54]
   Title                    Replace "INDENTIFICATION"
                                       With --IDENTIFICATION--

Column 1, line 2           Replace "INDENTIFICATION"
                                     With --IDENTIFICATION--

Column 3, line 28          Replace "programing"
                                     With --programming--

Column 4, line 30          Replace "programing"
                                     With --programming--

Signed and Sealed this

Seventeenth Day of February, 1998

*Attest:*

BRUCE LEHMAN

*Attesting Officer*     *Commissioner of Patents and Trademarks*